United States Patent
Mishra et al.

(10) Patent No.: US 10,044,497 B2
(45) Date of Patent: Aug. 7, 2018

(54) LOSS OF SIGNAL DETECTION ON CDR

(71) Applicant: INPHI CORPORATION, Santa Clara, CA (US)

(72) Inventors: Parmanand Mishra, Cupertino, CA (US); Simon Forey, Northamptonshire (GB)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/337,072

(22) Filed: Oct. 28, 2016

(65) Prior Publication Data
US 2017/0063520 A1    Mar. 2, 2017

Related U.S. Application Data

(63) Continuation of application No. 14/842,699, filed on Sep. 1, 2015, now Pat. No. 9,515,852.

(51) Int. Cl.
| | |
|---|---|
| *H03D 3/24* | (2006.01) |
| *H04L 7/033* | (2006.01) |
| *H04L 25/02* | (2006.01) |
| *H04L 12/26* | (2006.01) |
| *H03L 7/00* | (2006.01) |
| *H04L 7/00* | (2006.01) |
| *H04B 17/318* | (2015.01) |
| *H04L 27/01* | (2006.01) |
| *H03M 9/00* | (2006.01) |

(52) U.S. Cl.
CPC ............. *H04L 7/0331* (2013.01); *H03L 7/00* (2013.01); *H04B 17/318* (2015.01); *H04L 7/0083* (2013.01); *H04L 7/0091* (2013.01); *H04L 25/0262* (2013.01); *H04L 27/01* (2013.01); *H04L 43/04* (2013.01); *H04L 43/16* (2013.01); *H03M 9/00* (2013.01); *H04L 7/033* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,254,169 | B1 * | 8/2007 | Steiner | H03F 3/45183 327/52 |
| 2001/0050580 | A1 * | 12/2001 | O'Toole | G06K 7/0008 327/158 |
| 2002/0126786 | A1 * | 9/2002 | Cho | H03L 7/081 375/373 |
| 2014/0281071 | A1 * | 9/2014 | Xu | G06F 13/42 710/105 |

* cited by examiner

*Primary Examiner* — Wednel Cadeau
(74) *Attorney, Agent, or Firm* — Richard T. Ogawa; Ogawa P.C.

(57) ABSTRACT

The present invention is directed to data communication. More specifically, an embodiment of the present invention provides a technique for detecting loss of signal. An incoming data stream is sampled and a recovered clock signal is generated accordingly. An output clock signal of a higher frequency than the recovered clock signal is generated by a transmission PLL. The frequency of the recovered clock signal is compared to a divided frequency of the output clock signal. If a difference between the recovered clock signal and the output clock signal is greater than a threshold, a loss of signal indication is provided. There are other embodiments as well.

19 Claims, 7 Drawing Sheets

LOSS OF SIGNAL DETECTION ON CDR

CROSS-REFERENCES TO RELATED APPLICATIONS

The present application is a continuation of and claims priority to U.S. application Ser. No. 14/842,699 filed Sep. 1, 2015, the entire contents of which are incorporated herein by reference.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to data communication.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, serializer/deserializer (SERDES) are often used.

Over the past, there have been many types of communication systems and methods. Unfortunately, they have been inadequate for various applications. More specifically, detecting loss of signal can be challenging. Therefore, improved systems and methods are desired.

BRIEF SUMMARY OF THE INVENTION

The present invention is directed to data communication. More specifically, an embodiment of the present invention provides a technique for detecting loss of signal. An incoming data stream is sampled and a recovered clock signal is generated from receiver accordingly. In CDR (clock and data recovery) the recovered clock is send to transmitter for signal regeneration. An output clock signal of a higher frequency than the recovered clock signal is generated by a narrow-band transmission PLL. The frequency of the recovered clock signal is compared to a divided frequency of the output clock signal. If a difference between the recovered clock signal and the output clock signal is greater than a threshold error level, a loss of signal indication is provided. There are other embodiments as well.

According to an embodiment, the present invention provides a SERDES device. The device includes an input terminal for processing an input data stream that is characterized by a receiver data frequency. The device also includes an equalizer module that is configured to generate an equalizer output signal based on the input data stream. The device further includes a sense amplifier configured to sample the equalizer output signal and provide a sample data stream. The device also includes a receiver PLL characterized by a first frequency range. The receiver PLL is configured to generate a recovered clock signal at a incoming data frequency. The receive PLL is characterized by a first frequency range. The device additionally includes a second PLL (transmitter PLL) that has a PLL core and a detection module. The PLL core is configured to generate a transmission clock signal at a data frequency using the recovered clock signal. The PLL core is characterized by a second frequency range that is very smaller than the receive frequency range. The detection module is configured to generate a locking indication based on a first frequency count of the recovered clock signal and a second frequency count of the transmission clock signal over a predetermined period of time.

According to another embodiment, the present invention provides a SERDES device that includes an input terminal for processing an input data stream that is characterized by a receiver data frequency. The device also includes an equalizer module configured to generate an equalizer output signal based on the input data stream. The device further includes a sense amplifier configured to sample the equalizer output signal and provide a sample data stream. The device also includes a first PLL characterized by a first frequency range. The first PLL is configured to generate a recovered clock signal at a second data frequency. The first PLL is characterized by a first frequency range. The device further includes a second PLL configured to generate a transmission clock signal at a third data frequency using at least the recovered clock signal. The PLL second is characterized by a second frequency range. The second frequency range is smaller than the first frequency range. The third data frequency is greater than the second data frequency by a predetermined ratio. The device additionally includes a detection module that has a frequency divider and a frequency comparator. The frequency divider is configured to divide the transmission clock signal by the predetermined ratio. The frequency comparator is configured to determine whether a difference between the divided transmission clock signal and the recovered clock signal is greater than a predetermined threshold. The detection module is configured to provide a loss of signal indication if the difference is greater than the predetermined threshold.

According to yet another embodiment, the present invention provides a method for loss of signal detection. The method includes receiving an incoming data stream that is characterized by a first frequency. The method also includes sampling the income data stream to obtain sampled data. The method also includes generating a recovered clock signal for the sampled data, the recovered clock signal being characterized by a second frequency. The method additionally includes generating an output clock signal that is characterized by a third frequency. The third frequency is m times the frequency of the second frequency. The method also includes dividing the output clock signal by a factor of m. The method additionally includes determining a first duty cycle count for the recovered clock signal during a first time interval. The method further includes determining a second duty cycle count for the divided output clock signal during the first time interval. The method also includes calculating a difference between the first duty cycle count and the second duty cycle count. The method additionally includes generating a loss of signal indication if the difference is greater than a predetermined threshold.

It is to be appreciated that embodiments of the present invention provide numerous advantages over existing technology. Compared to conventional techniques, embodiments of the present invention can be implemented efficiently without specialized hardware modules, as frequency divider and frequency comparators used in loss of signal detection can be easily implemented. Embodiments of the present invention use existing transmission PLL (with receiver) for loss of signal detection. In addition, embodiments of the present invention can be implemented using existing hardware and manufacturing processes with minimal modifications. There are other benefits as well.

The present invention achieves these benefits and others in the context of known technology. However, a further understanding of the nature and advantages of the present invention may be realized by reference to the latter portions of the specification and attached drawings.

DETAILED DESCRIPTION OF THE INVENTION

Figure 1:
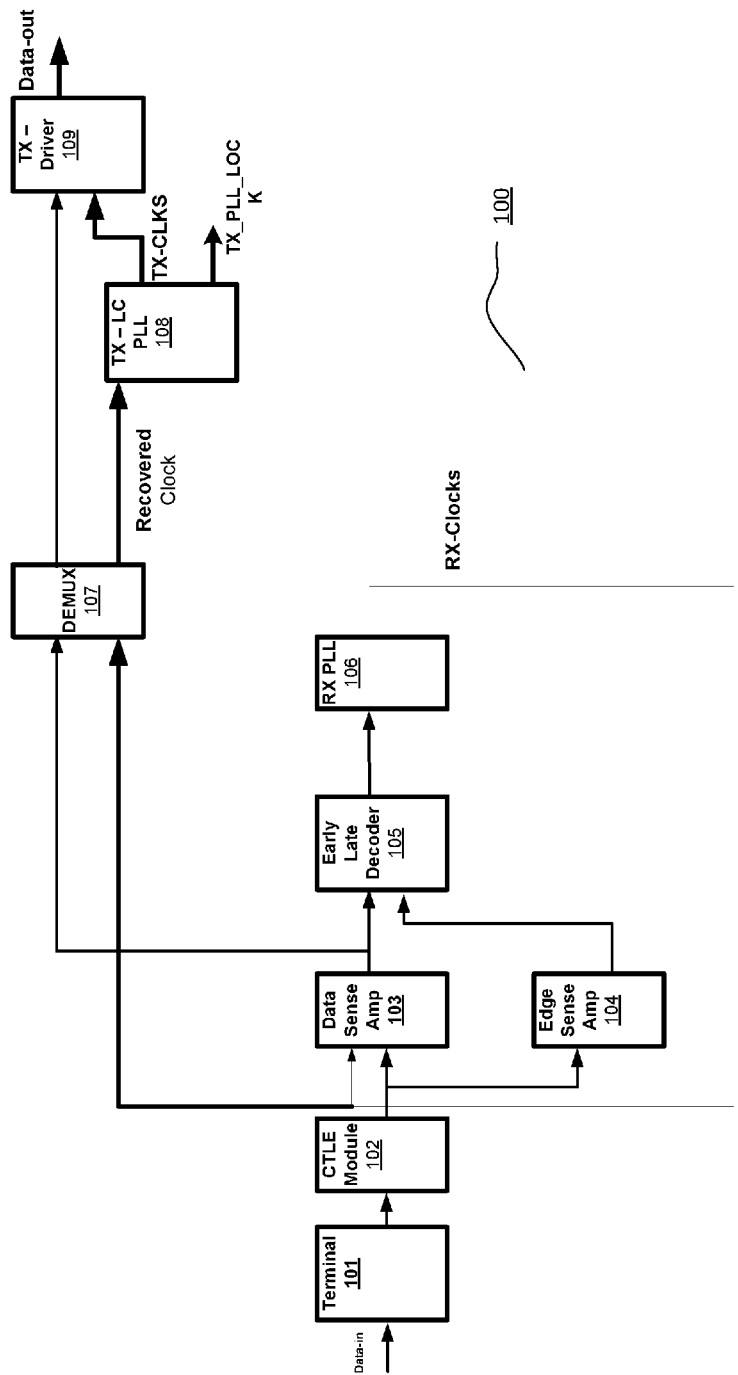
FIG. 1 is a simplified diagram illustrating a SERDES device 100 according to an embodiment of the present invention.

The present invention is directed to data communication. More specifically, an embodiment of the present invention provides a technique for detecting loss of signal. An incoming data stream is sampled and a recovered clock signal is generated accordingly. An output clock signal of a higher frequency than the recovered clock signal is generated by a transmission PLL. The frequency of the recovered clock signal is compared to a divided frequency of the output clock signal. If a difference between the recovered clock signal and the output clock signal is greater than a threshold, a loss of signal indication is provided. There are other embodiments as well.

As mentioned above, SERDES data communication system systems often require a loss of signal (LOS) detector that indicates whether a signal is present on the high-speed receiver terminal. For example, an LOS detector allows a system to power down to save power if signal is not present at the receiver terminal. Often, to detect whether signal is present, signal strength is examined to see if the signal has enough amplitude for sampling. Additionally, data frequency of the incoming signal is examine to see if this frequency is within the operable range of the system. Over the past, there have been conventional techniques for LOS detection, but they are often inadequate for having negative impact on signal integrity and large power/area overhead. It is thus to be appreciated that embodiments of the present invention provide improved techniques of LOS detection.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a SERDES device 100 according to an embodiment of the present invention. This diagram is merely an example, which should not unduly limit the scope of the claims. One of ordinary skill in the art would recognize many variations, alternatives, and modifications. As shown in FIG. 1, device 100 includes a terminal 101 for receiving incoming data. For example, terminal 101 is connected to a data communication link, which may include optical communication link or other types of communication lines. Terminal 101 is connected to the continuous time linear equalization (CTLE) module 102. For example, the CTLE 102 may be implemented as an equalizer module. As an example, an "output" of a CTLE typically includes a positive output and a negative output, as a pair of outputs. Module 102 is connected to data sense amplifier 103 and edge sense amplifier 104. Additionally, module 102 is connected to DEMUX module 107, which provides a digital output. For example, DEMUX module 340 corresponds to DEMUX module 107 in FIG. 1 as a part of the SERDES 100. As mentioned above, sampling typically involves two or more samplers. For example, the data sense amplifier 103 is used for data sampling, and edge sense amplifier 104 is configured for edge sampling. It is to be understood the data sense amplifier 103 and the edge sense amplifier 104 together amplify data received from the equalizer module 102. In certain scenarios, signal strength of the incoming data may be too small even after amplification by the sense amplifiers, and in such case outputs of the sense amplifiers may simply be noise. Data sense amplifier 103 and the sense amplifier 104 are connected to decoder 105. Decoder, or sometimes referred to as "early/late detection module", is configured to determine whether the incoming data is early or late, which is typically measured in phase. For example, the decoder 105 comprises shift detection mechanisms for determining whether the incoming signal is sampled early or late. The decoder 105 is coupled to a phase-lock loop (PLL) module 106.

In various embodiments, the PLL module 106 is configured to provide clock signal recovery. In various embodiments, the PLL module 106 includes a charge pump, loop filter, voltage controlled oscillator, program delay, and/or other components. The output of the PLL module 105 comprises a recovered clock signal that is provided to data sense amplifier 103 and the edge sense amplifier 104 as shown. Data sampled by the sense amplifiers 103 and 104 are provided to the DEMUX module 107. Additionally, the recovered clock signal generated by the PLL 106 is used during the data transmission process, as the recovered clock signal corresponds to the data sampled by the sense amplifiers. As a receiver PLL (RX PLL), the PLL 106 is configured to function at a wide frequency range, thereby allowing it to generate a recovered clock signal that matches the frequency of the incoming data received at terminal 101.

The recovered data is then to be transferred at an output clock frequency, which is different from frequency of the recovered clock signal. To do so, the transmission (TX) driver 109 transfers output data at the output clock frequency provided by the transmission (TX) PLL 108. In various embodiments, the TX PLL 108 provides frequency multiplying, where the output clock frequency can be much higher than frequency of the recovered clock signal. For example, TX PLL 108 is configured to multiply the frequency of the recovered clock signal by a factor of m and provide a high frequency output clock signal. The transmission driver 109 uses the data received from the DEMUX module 107 and the output clock signal from the TX PLL 108 to generate an data output.

Figure 2:
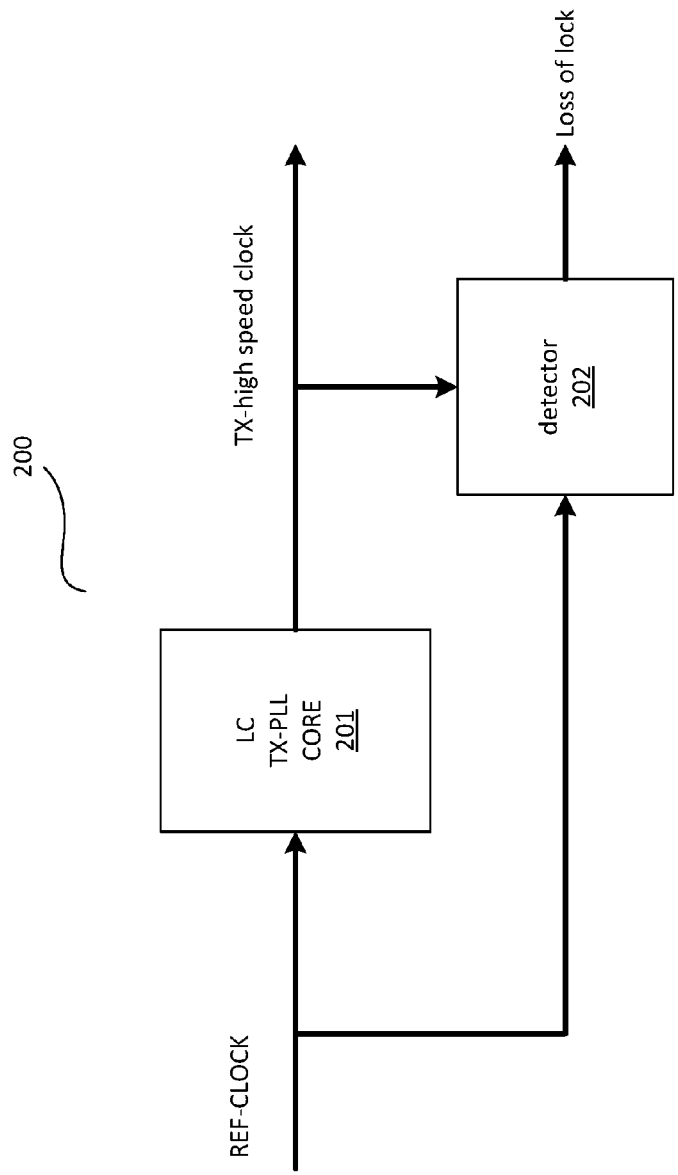
FIG. 2 is a simplified diagram illustrating a transmission PLL module 200 according to an embodiment of the present invention.

FIG. 2 is a simplified diagram illustrating a transmission PLL module 200 according to an embodiment of the present invention. This diagram is merely an example, which should not unduly limit the scope of the claims. One of ordinary skill in the art would recognize many variations, alternatives, and modifications. For example, transmission PLL module 200 can be used as TX PLL 108 illustrated in FIG. 1. Among other features, module 200 includes a core 201 and a detector 202. Core 201 is configured to change the reference clock frequency by a predetermined amount. In various embodiments, core 201 is specifically configured to increase the clock signal frequency by a factor m, as mentioned above. For example, core 201 comprises inductor and capacitor (i.e., LC) elements that operate in conjunction with PLL elements to provide a high-frequency low-jitter output clock signal. The frequency multiplier m, for example, is predetermined or set according to the frequency of the transmission link. For transmission over an optical communication network, a transmission frequency is used, and the frequency multiplier m is determined by a communication system to provide the frequency needed for data transmission. The TX PLL 108, with its inductive and capacitive elements, are implemented as a narrow (compared to the frequency band of the RX PLL module 106 in FIG. 1) band PLL. In contrast, the receiver PLL 106 in FIG. 1 is used to recover clock signal from the data received and thus is specifically selected to work with a large frequency band. Since the PLL module 200 has a much smaller bandwidth (e.g., can be smaller by a factor of 100 or more) than the RX PLL 106 in FIG. 1, the PLL module 200 would lose lock on the recovered clock signal from the RX PLL 106 if the recovered clock signal is not stable (e.g., typically due to signal strength or due to out of band frequency).

It is to be appreciated that the loss of signal on the recovered clock signal be caused in different scenarios, such as frequency mismatch, low signal-to-noise ratio (SNR), and/or others. For example, when the recovered clock signal provided by the RX PLL 106 is out of the narrow frequency band of the PLL module 200, frequency mismatch occurs, and the clock signal generated by the PLL module 200 does not provide the lock that the transmission needs. In certain scenarios, the received data is characterized by a low SNR, from which the recovered clock signal generated by the RX PLL 106 is mostly noise signal, and the PLL module 200 similarly cannot provide a lock between data and the clock signal needed for data transmission. When the PLL module 200 is unable to provide data lock, the detector 202 provides a loss of signal signal, from which the communication knows that the data transmission based on the output clock signal of the PLL module 200 is not locked, and thus likely to be unusable data.

The detector 202 is configured to provide a loss of signal indication by monitoring the recovered clock signal received from the RX PLL 106 and the output clock signal generated by the TX PLL 201. Among other features, detector 202 comprises a frequency divider and a frequency comparator. Since the output clock signal is an m multiple of the reference clock signal from the RX PLL 106, performing frequency comparison involves first diving the output clock signal by a factor of m and comparing the divided output clock signal to the reference clock signal. For example, the frequency comparator of detector 202 is characterized by a frequency range, which is typically less than 700 MHz. Thus, for the purpose of comparing the recovered clock signal and the output clock signal, it is preferable to divide the frequency of the output clock signal for comparison at the lower frequency. For example, if the frequency of the output clock signal is greater than the upper limit of the frequency comparator frequency range, performing frequency comparison at the frequency of the output clock signal is simply not possible.

To detect whether the clock signal has lost the signal, a predetermined number n of duty cycles are compared. For example, for the purpose of having a statistically significant number of cycles compared, n is typically greater than 10,000. It is to be appreciate that since recovered clock signal is typically operating at a frequency on the order of 1 MHz or higher, comparing 10,000 duty cycles can be accomplished within a fraction of a second.

In a specific embodiment, detector 202 counts the number $n_r$ of falling edges (or rising edges) for the recovered clock signal and the number $n_t$ of falling edges (or rising edges) for the divided output clock signal within a predetermined period of time (e.g., 100 ms). If the clock signals are locked, the difference $n_e$ between $n_r$ and $n_t$ should be less than or equal to a predetermined error rate (e.g., less than 10). If $n_e$ is greater than the predetermined error rate, detector 202 generates a loss of signal indication to indicate that the clock signals are not locked. For example, detector 202 includes one or more counters to store $n_e$, $n_f$, and/or $n_e$. It is to be appreciated that depending on the implementation, loss of lock detection process can be performed in real time or periodically.

Figure 3:
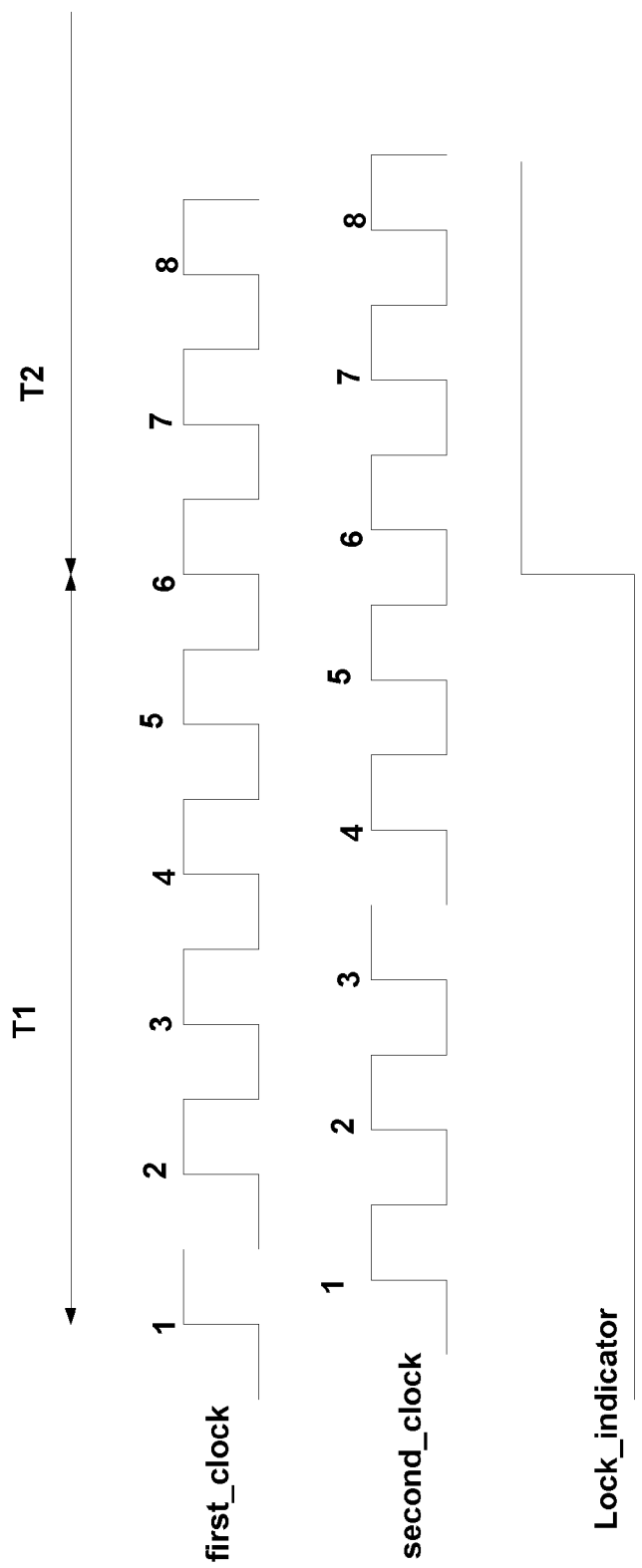
FIG. 3 is a simplified timing diagram illustrating operation of lock detection according to an embodiment of the present invention.

FIG. 3 is a simplified timing diagram illustrating operation of lock detection according to an embodiment of the present invention. This diagram is merely an example, which should not unduly limit the scope of the claims. One of ordinary skill in the art would recognize many variations, alternatives, and modifications. For example, the first clock correspond to the recovered clock signal generated by the RX PLL, and the second clock corresponds to the output clock signal after divided by a factor of m, m being the frequency multiplier factor of the TX PLL. The time interval "T1" is the predetermined time period during which lock detection is performed. As can be seen in FIG. 3, second clock lags behind the first clock, which is attributed to the delay due to processing performed by the TX PLL and the frequency divider. At the end of the time interval "T1", the first clock and the second clock both complete five duty cycles as shown, which means that clock signals are properly locked, and the lock indicator at end of T1 is "1", indicating the lock status. It is to be understood that FIG. 3 merely provides an illustration. In actual operation, a much larger number (e.g., 10,000 or more) of duty cycles are counted and compared to determine whether there is a proper lock.

Figure 4:
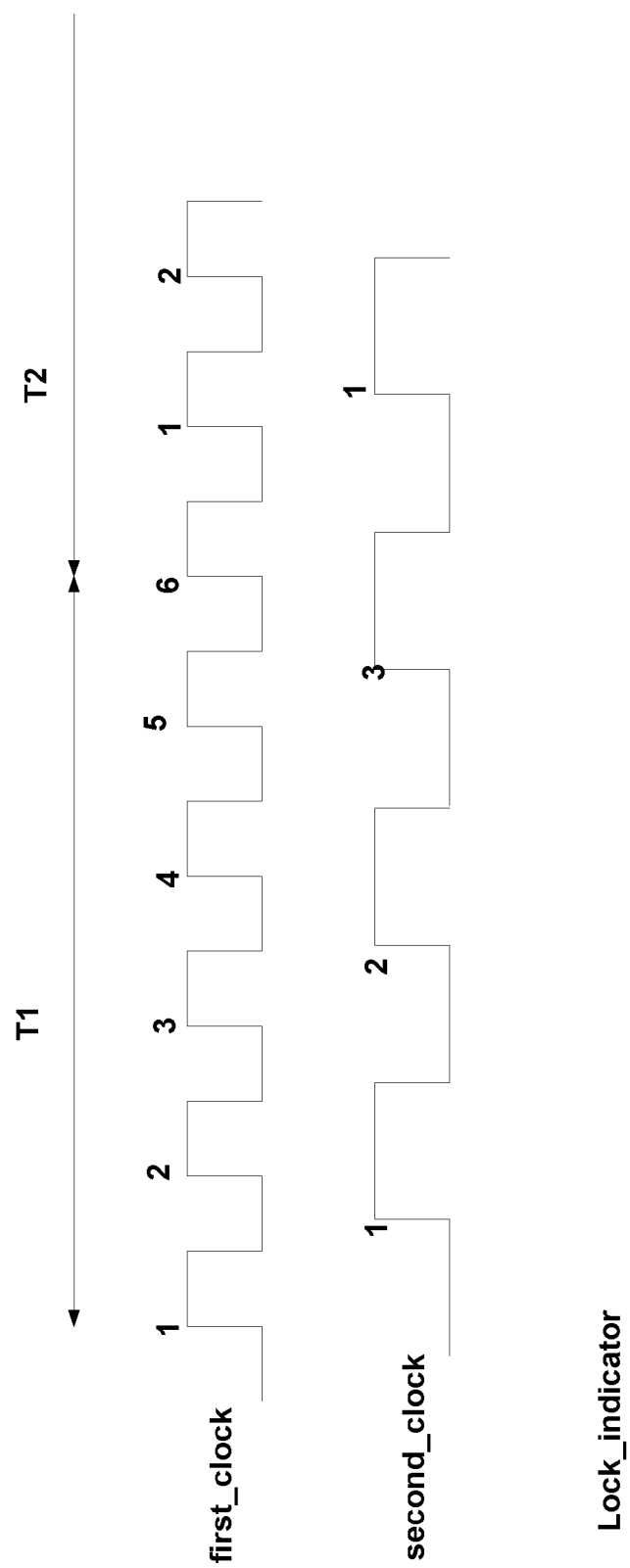
FIG. 4 is a simplified diagram illustrating a frequency mismatch scenario according to embodiments of the present invention.

FIG. 4 is a simplified diagram illustrating a frequency mismatch scenario according to embodiments of the present invention. This diagram is merely an example, which should not unduly limit the scope of the claims. One of ordinary skill in the art would recognize many variations, alternatives, and modifications. For example, the first clock correspond to the recovered clock signal generated by the RX PLL, and the second clock corresponds to the output clock signal after divided by a factor of m, m being the frequency multiplier factor of the TX PLL. The time interval "T1" is the predetermined time period during which lock detection is performed. For example, the first clock signal may be within the operating frequency band of the RX PLL, which has a much greater range than frequency range of the TX PLL, but the first clock signal is not within the operating frequency band of the RX PLL, and as a result of this frequency mismatch, the output clock signal is not properly locked. As shown in FIG. 4, the first clock has five complete duty cycles within the time interval "T1", while the second clock only has two complete duty cycles during the same time interval, which means that there is no lock. The lock indicator at the end of "T1" is thus "0", which indicates that there is no lock.

It is to be appreciated that when the signal strength is low (or signal is simply not present), the LOS detection systems and techniques according the present invention can efficiently determine loss of signal. In one of the low-signal strength scenarios, the signal strength (and the SNR) is simply too low for the system to make use of the signal received from the input terminal. In another low-signal strength scenarios, the signal strength on the input terminal may occasionally be strong enough for the system to covert to clock signals, but unfortunately the received signal is mostly unusable noise. Embodiments of the present invention detects both of these scenarios. For example, if signal strength is too low when compared to a predetermined threshold level, the LOS detection system simply outputs an indication that the signal is loss. However, when the signal strength is greater than the predetermined threshold level, there could a "false negative" determination of signal loss, and thus a different type of LOS detection is performed, where the difference in the numbers of duty cycles between the recovered clock signal and the output clock signal is compared.

Figure 5A:
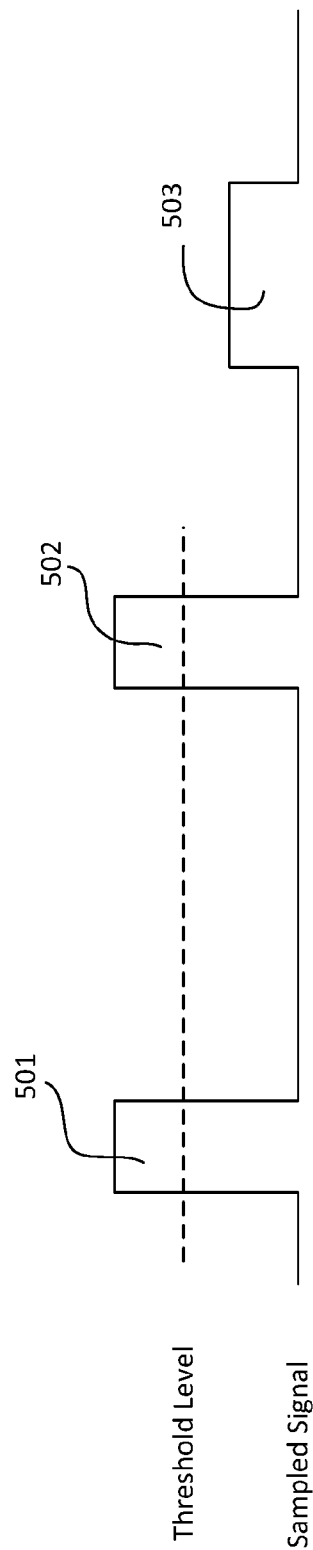
FIG. 5A is a simplified diagram illustrating a low signal strength scenario according to embodiments of the present invention.

FIG. 5A is a simplified diagram illustrating a low signal a strength scenarios according to an embodiment of the present invention. This diagram is merely an example, which should not unduly limit the scope of the claims. One of ordinary skill in the art would recognize many variations, alternatives, and modifications. As shown in FIG. 5A, at time 501 and 502, the sampled signal has a signal strength that is greater than the threshold level. At time 503, the sampled signal has signal strength that is below the threshold level. At time 503, by simply comparing the signal strength to the threshold level, a LOS detection mechanism can easily determine that signal strength is too low and a LOS indication should be provided. At time 501 and 502, the signal strength is above the threshold level, but it should not be concluded that signal (or usable signal) is present on the input terminal, as strength of random noise may be high enough to be above the threshold level. Thus, if the signal strength is greater than the predetermined threshold level, it simply means different determinations need to be made.

Figure 5B:
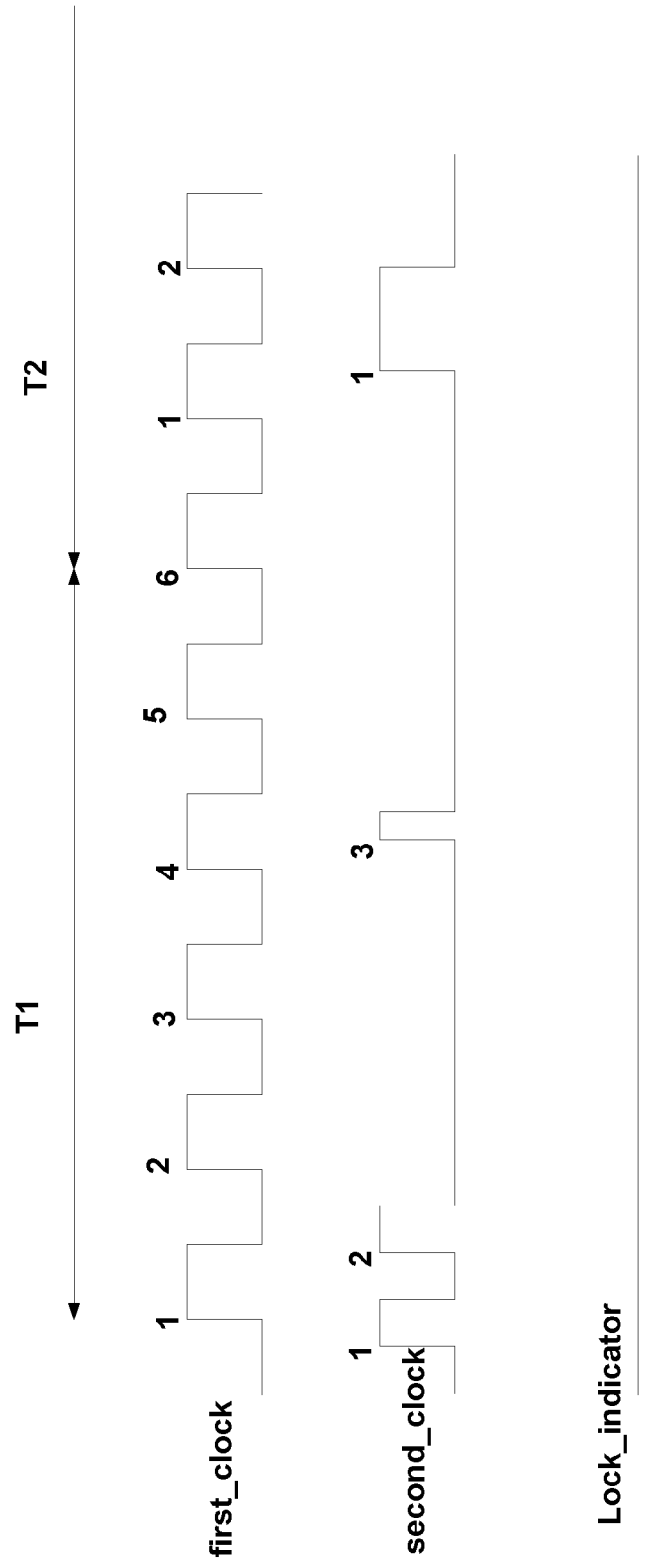
FIG. 5B is a simplified diagram illustrating another low signal strength scenario according to embodiments of the present invention.

FIG. 5B is a simplified diagram illustrating another low signal strength scenario according to embodiments of the present invention. This diagram is merely an example, which should not unduly limit the scope of the claims. One of ordinary skill in the art would recognize many variations, alternatives, and modifications. For example, the first clock correspond to the recovered clock signal generated by the RX PLL, and the second clock corresponds to the output clock signal after divided by a factor of m, m being the frequency multiplier factor of the TX PLL. The time interval "T1" is the predetermined time period during which lock detection is performed. When the signal strength is low, the RX PLL sometimes still recover some "clock signals" that are essentially random data that cannot be locked or transmitted. As can be seen in FIG. 5, the first clock as shown has a number of duty cycles, which may even seem regular. However, after multiplied by the TX PLL and then divided by the lock detector module, the corresponding second clock as shown includes random duty cycles at irregular intervals. During the time interval "T1", the first clock has five complete duty cycles, and the second clock has three complete duty cycles. By comparing the number of the complete duty cycles during T1, the detectors determines that there is no lock. The lock indicator at the end of "T1" is thus "0", which indicates that there is no lock. It is to be appreciated that by comparing the number of duty cycles within a predetermined time interval, a "false negative" LOS detection scenario explained above can be detected.

It is to be appreciated that while there can be various causes, not all of which being described here, the detection technique according to embodiments of the present invention can reliably and efficiently detect loss of lock without requiring extensive detection hardware. By tracking a large number of duty cycles (e.g., 10,000 or more cycles), the chance of recovered clock signal and the output clock signal having almost the same number of duty cycles within a time interval is almost zero.

Figure 6:
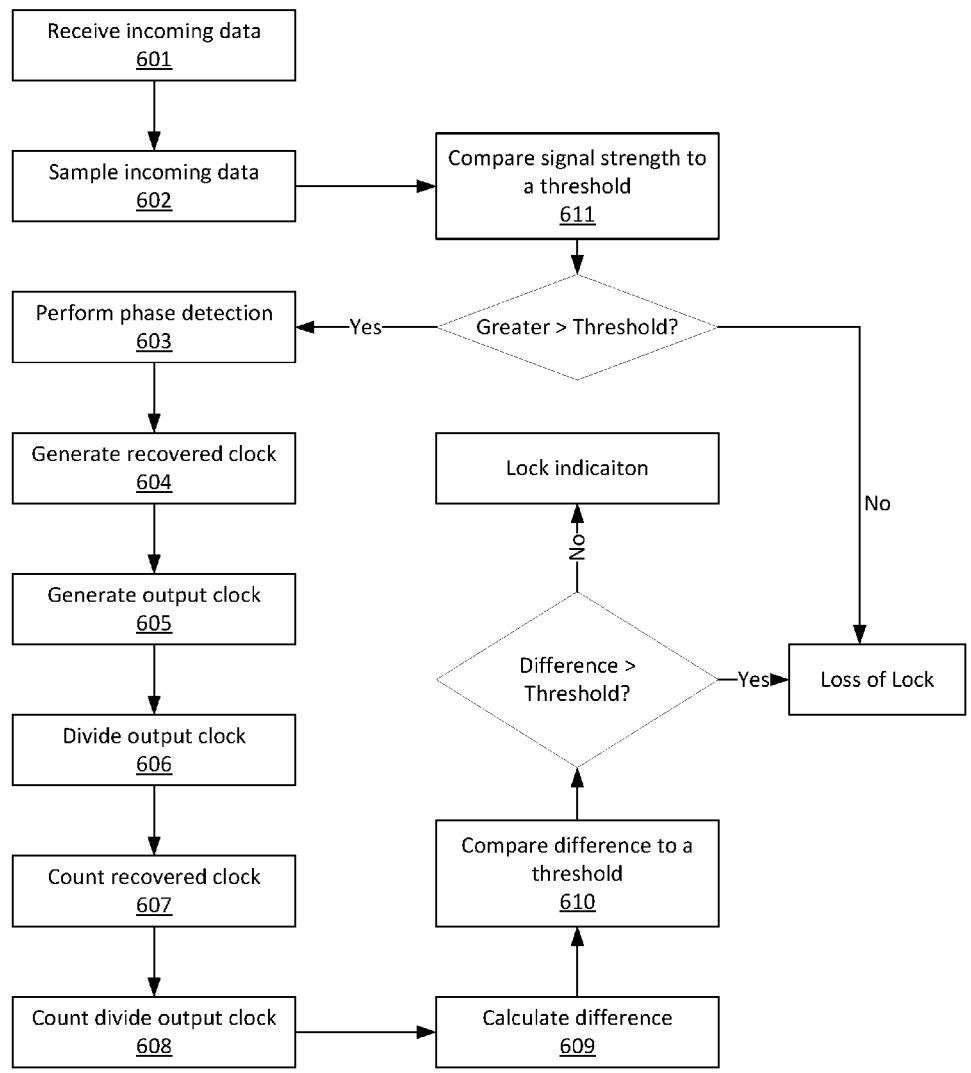
FIG. 6 is a simplified flow diagram illustrating a process to detect lock status according to an embodiment of the present invention.

FIG. 6 is a simplified flow diagram illustrating a process to detect lock status according to an embodiment of the present invention. This diagram is merely an example, which should not unduly limit the scope of the claims. One of ordinary skill in the art would recognize many variations, alternatives, and modifications. For example, one or more steps illustrated in FIG. 6 and described below may be added, removed, repeated, rearranged, modified, replaced, and/or overlapped and should not unduly limit the scope of the claims.

At step 601, incoming data are received. For example, incoming data is receive by a data terminal. For example, terminal 101 illustrated in FIG. 1 is receives data from a data communication line. An equalizer (e.g., CTLE) module may be used to process the incoming data.

The incoming data is then sampled, at step 602. For example, sample may be performed by sense amplifiers as shown in FIG. 1. Sense amplifier, data amplifier, and/or other types of amplifiers may be implemented in conjunction with one another to provide edge sampling and data sampling as needed. For example, during the sampling process, incoming data may be amplified as needed to provide enough SNR for processing and transmission.

The signal strength of the sampled incoming data is compared to a predetermined threshold level, at step 611. As explained above (and illustrated in FIG. 5A), if the signal strength is below a predetermined threshold level, it means that the sampled data are likely to be noise or otherwise useless. In such scenario, is it unnecessary and wasteful (in terms of power consumption and computation cost) to perform additional work on the sampled data, and a loss of lock indication is provided. On the other hand, if the signal strength is above the predetermined threshold level, it could be that the noise or otherwise unusable data are present, and to determine whether there is a loss of lock, additional steps are needed, and phase detection is performed next at step 603.

Phase detection is performed at step 603. For example, phase detection may be performed by an early/late decoder module that determines whether the incoming data is early or late, which is typically measured in phase. For example, the decoder 105 illustrated in FIG. 1 comprises shift detection mechanisms for determining whether the incoming signal is sampled early or late.

A recovered clock signal is generated at step 604. For example, the RX PLL 106 is specifically configured to work in conjunction with decoder to generate a recovered clock signal. For example, in high-speed serial data communication (e.g., incoming data received from a disk storage), incoming data are sometimes without clock signal. Based on the data rate, the RX PLL 106 works with the phase detector to generate a recovered (or sometimes referred to as reference) clock signal that is phase-aligned to the incoming data.

An output clock signal is generated at step 605. For example, TX PLL 108 illustrated in FIG. 1 provides frequency multiplying, where the output clock frequency can be much higher than frequency of the recovered clock signal. The output clock signal is characterized by m times the frequency of the recovered clock signal.

For the purpose of lock detection, the output clock signal is divided by a factor of m at step 606. As illustrated in FIG. 2, the detector module comprises a frequency divider that divides the frequency of the output signal by a factor m, which allows the divided output clock signal to be compared to the recovered clock signal.

At step 607, the number $n_r$ of duty cycles of the recovered clock signal during a predetermined time interval is counted. For example, the time interval is specifically selected to allow a statistically large number of duty cycles to be counted. For example, for a recovered clock signal that operates at about 100 MHz, to obtain 10,000 duty cycles, a fraction of a second is needed.

At step 608, the number $n_t$ of duty cycles of the output clock signal during the same time interval is counted. For example, the number of duty cycles can be counted by the number of rising or falling edges. At step 609, the difference $n_e$ between $n_r$ and $n_t$ is calculated. It is to be understood a small difference $n_e$ between $n_r$ and $n_t$ may exist even when there is a proper lock, which can be attributed to delay and computational rounding (e.g., multiplying and dividing) between the recovered clock signal and the output clock signal. According, a predetermined threshold difference is used. For example, for 10,000 duty cycles, the threshold difference may be less than 10, or even less than 2. At step 609, the difference $n_e$ is compared to the predetermined threshold. For example, if the difference is greater than the threshold, then a loss of signal or loss of lock indication is generated; on the other hand, if the difference is not greater than the threshold, a lock indication is generated.

It is to be understood that the lock detection is an aspect of data transmission process. For example, if the loss of signal determination is made, the data transmission may be suspended and wait for corrective measures. On the other hand, if the lock determination is made, data transmission processes proceed. For example, as a part of a SERDES, incoming data is sampled and transmitted with at a high data frequency.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A SERDES device comprising:
an input terminal for processing an input data stream, the input data stream being characterized by a first data frequency;
an equalizer module being configured to generate an equalizer output signal based on the input data stream;
a sense amplifier being configured to sample the equalizer output signal and provide a sample data stream;
a first PLL characterized by a first frequency range, the first PLL being configured to generate a recovered clock signal at a second data frequency, the first PLL being characterized by a first frequency range;
a second PLL being configured to generate a transmission clock signal at a third data frequency using at least the recovered clock signal, the second PLL being characterized by a second frequency range, the second PLL being unable to lock on the recovered clock signal and generating an incorrect clock signal if the recovered clock signal is not stable, the second frequency range being smaller than the first frequency range, the third data frequency being greater than the second data frequency by a predetermined ratio, the predetermined ratio being determined based on a ratio between the third data frequency and the second data frequency; and
a detection module comprising a frequency divider and a frequency comparator, the frequency divider being configured to divide the transmission clock signal by the predetermined ratio, the frequency comparator being configured to determine whether a difference between the divided transmission clock signal and the recovered clock signal is greater than a predetermined threshold, the difference in a clock count being associated with the incorrect clock signal and the recovered clock signal, the detection module being configured to provide a loss of signal indication if the difference is greater than the predetermined threshold.

2. The device of claim 1 wherein the detection module comprises counters for store a number of duty cycles associated with the divided transmission clock signal and the recovered clock signal within a predetermined time interval.

3. The device of claim 1 further comprising a phase detection module for processing the sample data stream.

4. The device of claim 1 wherein the sense amplifier comprises a data sense amplifier and an edge sense amplifier.

5. The device of claim 1 further comprising a transmission driver configured to transmit the sample data stream using the transmission clock signal.

6. The device of claim 1 further comprising an optical communication interface for transmitting the sample data stream at the third data frequency.

7. The device of claim 1 wherein the equalizer comprises a CTLE module.

8. The device of claim 1 further comprising a phase detection logic.

9. The device of claim 1 wherein the second PLL comprises an inductor and a capacitor.

10. A method for lock detection, the method comprising:
receiving an incoming data stream, the incoming data stream being characterized by a first frequency;
sampling the income data stream to obtain sampled data;
generating a recovered clock signal for from the sampled data using a first PLL, the recovered clock signal being characterized by a second frequency;
generating an output clock signal using a second PLL, the output clock signal being characterized by a third frequency, the third frequency being m times the frequency of the second frequency, the second PLL being unable to lock on the recovered clock signal and generating an incorrect clock signal if the recovered clock signal is not stable, the second PLL being characterized by smaller frequency bandwidth than the first PLL;
dividing the output clock signal by a factor of m;
determining a first edge count for the recovered clock signal during a first time interval;
determining a second edge count for the divided output clock signal during the first time interval, the second edge count being associated with incorrect clock signal;
calculating a difference between the first edge count and the second edge count; and
generating a loss of signal indication if the difference is greater than a predetermined threshold.

11. The method of claim 10 further comprising performing phase detection on the sampled data.

12. The method of claim 10 further comprising transmitting the sampled data using the output clock signal at the third frequency.

13. The method of claim 10 further comprising comparing a signal strength of the sampled data to a predetermined threshold level.

14. The method of claim 10 further comprising outputting a loss of signal indication during a second time interval if the difference is greater than the predetermined threshold.

15. A method for lock detection, the method comprising:
receiving an input data stream, the input data stream being characterized by a first frequency;
performing equalization on the input data stream to generate an equalizer output signal;
sampling the equalizer output signal to provide a sample data stream;
generating a recovered clock signal at a second data frequency using a first PLL, the first PLL being characterized by a first frequency range;
generating a transmission clock signal at a third frequency using at least the recovered clock signal using a second PLL, the second PLL being characterized by a second frequency range, the second frequency range being smaller than the first frequency range, the second PLL being unable to lock on the recovered clock signal and generating an incorrect clock signal if the input data stream is unstable, the third frequency being greater than the second data frequency by a predetermined ratio, the predetermined ratio being determined based on a ratio between the third frequency and the second frequency; and
generating a locking indication based on a first duty cycle of the recovered clock signal and a second duty cycle count of the transmission clock signal over a predetermined period of time, the locking indication being based on a difference between a first clock cycle count associated with the recovered clock signal and a second clock cycle count associated with the incorrect clock signal during the predetermined period of time.

16. The method of claim 15 wherein the sampling is performed by a sense amplifier.

17. The method of claim 15 wherein the second PLL comprises a PLL core and a detection module.

18. The method of claim 15 further comprising generating an output data characterized by the third frequency.

19. The method of claim 17 wherein the detection module comprises a divider module.

* * * * *